United States Patent
Parkhe et al.

(10) Patent No.: US 11,088,005 B2
(45) Date of Patent: Aug. 10, 2021

(54) ELECTROSTATIC CHUCK HAVING THERMALLY ISOLATED ZONES WITH MINIMAL CROSSTALK

(71) Applicant: Applied Materials, Inc., Santa Clara, CA (US)

(72) Inventors: Vijay D. Parkhe, San Jose, CA (US); Konstantin Makhratchev, Fremont, CA (US); Jason Della Rosa, Campbell, CA (US); Hamid Noobakhsh, Fremont, CA (US); Brad L. Mays, Findlay, OH (US); Douglas A. Buchberger, Jr., Livermore, CA (US)

(73) Assignee: Applied Materials, Inc., Santa Clara, CA (US)

( * ) Notice: Subject to any disclaimer, the term of this patent is extended or adjusted under 35 U.S.C. 154(b) by 53 days.

(21) Appl. No.: 16/421,301

(22) Filed: May 23, 2019

(65) Prior Publication Data

US 2019/0279893 A1 Sep. 12, 2019

Related U.S. Application Data

(63) Continuation of application No. 15/977,718, filed on May 11, 2018, now Pat. No. 10,304,715, which is a
(Continued)

(51) Int. Cl.
| | |
|---|---|
| *H01L 21/683* | (2006.01) |
| *H01T 23/00* | (2006.01) |
| *H01L 21/67* | (2006.01) |

(52) U.S. Cl.
CPC .... *H01L 21/6833* (2013.01); *H01L 21/67103* (2013.01); *H01L 21/6831* (2013.01); *Y10T 156/10* (2015.01)

(58) Field of Classification Search
CPC ............. H01L 21/6833; H01L 21/6831; H01L 21/67103
(Continued)

(56) References Cited

U.S. PATENT DOCUMENTS

| | | |
|---|---|---|
| 4,439,248 A | 3/1984 | Herchenroeder et al. |
| 5,381,944 A | 1/1995 | Makowiecki et al. |

(Continued)

FOREIGN PATENT DOCUMENTS

| | | |
|---|---|---|
| JP | H0-6216224 A | 8/1994 |
| JP | 2000-306986 A | 11/2000 |

(Continued)

OTHER PUBLICATIONS

Taffner et al., "Preparation and Microstructural Analysis of High-Performance Ceramics," ASM Handbook Volume 9: Metallography and Microstructures, copyright 2004, 11 pages, ASM International, Materials Park, Ohio, USA.
(Continued)

*Primary Examiner* — Jared Fureman
*Assistant Examiner* — Lucy M Thomas
(74) *Attorney, Agent, or Firm* — Lowenstein Sandler LLP (57) ABSTRACT

A substrate support assembly includes a ceramic puck and a thermally conductive base having an upper surface that is bonded to the ceramic puck. The thermally conductive base includes a plurality of thermal zones and a thermally managed material embedded in the thermally conductive base at the upper surface of the thermally conductive base in one or more of the plurality of thermal zones. The thermally managed material has different thermal conductive properties along a first direction and a second direction. The thermally conductive base further includes a plurality of thermal isolators that extend from the upper surface of the thermally conductive base towards a lower surface of the
(Continued)

thermally conductive base between two or more of the plurality of thermal zones without contacting the lower surface of the thermally conductive base. Each of the plurality of thermal isolators provides a degree of thermal isolation.

20 Claims, 8 Drawing Sheets

Related U.S. Application Data continuation of application No. 15/595,870, filed on May 15, 2017, now Pat. No. 9,991,148, which is a continuation of application No. 14/268,994, filed on May 2, 2014, now Pat. No. 9,666,466.

(60) Provisional application No. 61/820,596, filed on May 7, 2013.

(58) Field of Classification Search
USPC .................................................. 361/234, 220
See application file for complete search history.

(56) References Cited

U.S. PATENT DOCUMENTS

| | | | |
|---|---|---|---|
| 5,548,470 A | 8/1996 | Husain et al. |
| 5,631,803 A | 5/1997 | Cameron et al. |
| 5,790,365 A | 8/1998 | Shel |
| 5,800,871 A | 9/1998 | Collins et al. |
| 5,916,689 A | 6/1999 | Collins et al. |
| 6,063,203 A | 5/2000 | Satoh |
| 6,194,083 B1 | 2/2001 | Yasuda et al. |
| 6,245,202 B1 | 6/2001 | Edamura et al. |
| 6,361,645 B1 | 3/2002 | Schoepp et al. |
| 6,506,254 B1 | 1/2003 | Bosch et al. |
| 6,534,194 B2 | 3/2003 | Weihs et al. |
| 6,581,275 B2 | 6/2003 | Narendrnath et al. |
| 6,616,031 B2 | 9/2003 | Wong et al. |
| 6,805,952 B2 | 10/2004 | Chang et al. |
| 6,933,254 B2 | 8/2005 | Morita et al. |
| 6,942,829 B2 | 9/2005 | Drabeck, Jr. et al. |
| 6,942,929 B2 | 9/2005 | Han et al. |
| 7,336,015 B2 | 2/2008 | Arlt et al. |
| 7,441,688 B2 | 10/2008 | Van Heerden et al. |
| 7,486,582 B2 | 2/2009 | Druilhe et al. |
| 7,615,133 B2 | 11/2009 | Tateno et al. |
| 7,649,729 B2 | 1/2010 | Buchberger, Jr. et al. |
| 7,690,308 B2 | 4/2010 | Nielson |
| 7,696,117 B2 | 4/2010 | Sun et al. |
| 7,718,007 B2 | 5/2010 | Oohashi et al. |
| 7,718,932 B2 | 5/2010 | Steger |
| 7,810,704 B2 | 10/2010 | Duckham et al. |
| 7,964,517 B2 | 6/2011 | Jaiswal |
| 8,034,734 B2 | 10/2011 | Sun et al. |
| 8,075,729 B2 | 12/2011 | Holland et al. |
| 8,206,829 B2 | 6/2012 | Sun et al. |
| 8,404,572 B2 | 3/2013 | Chang et al. |
| 9,991,109 B2 | 6/2018 | Zhou et al. |
| 2001/0055190 A1* | 12/2001 | Saito .................. H01L 21/6831 361/234 |
| 2002/0129475 A1 | 9/2002 | Tsai et al. |
| 2003/0007308 A1 | 1/2003 | Harada et al. |
| 2003/0047802 A1 | 3/2003 | Hiramatsu et al. |
| 2004/0187787 A1 | 9/2004 | Dawson et al. |
| 2005/0266682 A1 | 12/2005 | Chen et al. |
| 2006/0076108 A1 | 4/2006 | Holland et al. |
| 2006/0144516 A1 | 7/2006 | Ricci et al. |
| 2006/0164785 A1 | 7/2006 | Pellegrin |
| 2007/0047170 A1 | 3/2007 | Sun et al. |
| 2007/0212567 A1 | 9/2007 | Esaki et al. |
| 2007/0256785 A1 | 11/2007 | Pamarthy et al. |
| 2007/0258186 A1 | 11/2007 | Matyushkin et al. |
| 2008/0016684 A1 | 1/2008 | Olechnowicz et al. |
| 2008/0029032 A1 | 2/2008 | Sun et al. |
| 2008/0029211 A1 | 2/2008 | Sun et al. |
| 2008/0160462 A1 | 7/2008 | Herchen et al. |
| 2008/0174930 A1 | 7/2008 | Hattori et al. |
| 2008/0264564 A1 | 10/2008 | Sun et al. |
| 2008/0264565 A1 | 10/2008 | Sun et al. |
| 2008/0268645 A1 | 10/2008 | Kao et al. |
| 2009/0034147 A1 | 2/2009 | Narendrnath et al. |
| 2009/0034148 A1 | 2/2009 | Lubomirsky et al. |
| 2009/0034149 A1 | 2/2009 | Lubomirsky et al. |
| 2009/0036292 A1 | 2/2009 | Sun et al. |
| 2009/0214825 A1 | 8/2009 | Sun et al. |
| 2009/0284894 A1 | 11/2009 | Cooke |
| 2010/0053841 A1 | 3/2010 | Rusinko, Jr. et al. |
| 2010/0116788 A1 | 5/2010 | Singh et al. |
| 2010/0119843 A1 | 5/2010 | Sun et al. |
| 2010/0177454 A1 | 7/2010 | Elliot et al. |
| 2010/0314356 A1 | 12/2010 | Nagayama et al. |
| 2011/0049729 A1 | 3/2011 | Naundorf et al. |
| 2011/0149462 A1 | 6/2011 | Kugimoto et al. |
| 2011/0174441 A1 | 7/2011 | Yamashita et al. |
| 2011/0232888 A1 | 9/2011 | Sasaki |
| 2012/0034469 A1 | 2/2012 | Sun et al. |
| 2012/0076574 A1 | 3/2012 | Parkhe |
| 2012/0104703 A1 | 5/2012 | Sun et al. |
| 2012/0141661 A1 | 6/2012 | Cho et al. |
| 2012/0299253 A1 | 11/2012 | Kosakai et al. |
| 2012/0307412 A1 | 12/2012 | Boyd, Jr. et al. |
| 2013/0019797 A1 | 1/2013 | Tanaka et al. |
| 2013/0026720 A1 | 1/2013 | Hori et al. |
| 2013/0224675 A1 | 8/2013 | Park |

FOREIGN PATENT DOCUMENTS

| | | | |
|---|---|---|---|
| JP | 2006-216224 A | 8/2006 |
| JP | 2008-016709 A | 1/2008 |
| JP | 2008-085283 A | 4/2008 |
| JP | 2009-512193 A | 3/2009 |
| JP | 2001-308075 A | 11/2011 |
| WO | 01/24581 A1 | 4/2001 |
| WO | 03/100843 A2 | 12/2003 |
| WO | 2005/027203 A2 | 3/2005 |
| WO | 2007-041668 A1 | 4/2007 |
| WO | 2007/131057 A2 | 11/2007 |
| WO | 2010/055441 A2 | 5/2010 |

OTHER PUBLICATIONS

Bhatia et al., "Mechanisms of ceramic coating deposition in solution-precurosr plasma spray," J.Mater. Res., vol. 17, No. 9, Sep. 2002, 10 pages, Materials Research Society, Warrendale, PA, USA.

Di Girolamo et al., "Microstructure and thermal properties of plasma-sprayed ceramic thermal barrier coatings," Energia, Ambiente e Innovazione, Published Jan. 2, 2013.

Bergant et al., "Porosity evaluation of flame-sprayed and heat-treated coatings using image analysis," Image Anal Stereol 2011;30:53-62, Published Jan. 27, 2011.

Hass et al., "Gas jet assisted vapor deposition of yttria stabilized zirconia," Department of Materials Science and Engineering, School of Engineering and Applied Science, published Feb. 27, 2009, University of Virginia, Charlottesville, Virginia 22903.

International Search Report & Written Opinion of the International Searching Authority dated Sep. 16, 2014, in International Application No. PCT/US2014/036989.

* cited by examiner

ELECTROSTATIC CHUCK HAVING THERMALLY ISOLATED ZONES WITH MINIMAL CROSSTALK

RELATED APPLICATIONS

This application is a continuation application of U.S. patent application Ser. No. 15/977,718, filed May 11, 2018, which is a continuation application of U.S. patent application Ser. No. 15/595,870, filed May 15, 2017, issued as U.S. Pat. No. 9,991,148 on Jun. 5, 2018, which is a continuation of Ser. No. 14/268,994, filed May 2, 2014, issued as U.S. Pat. No. 9,666,466, on May 30, 2017, which claims the benefit of U.S. Provisional Application No. 61/820,596 filed on May 7, 2013, all of which are incorporated by reference herein.

TECHNICAL FIELD

Embodiments of the present invention relate, in general, to an electrostatic chuck having multiple thermally isolated zones with minimal crosstalk.

BACKGROUND

Electrostatic chucks are used to support substrates during processing. One function of an electrostatic chuck is to regulate a temperature of the supported substrate. To facilitate such temperature regulation, the electrostatic chucks may have multiple different zones, and each zone may be tuned to a different temperature. However, conventional electrostatic chucks may exhibit significant crosstalk between zones. In an example, assume that there are two adjacent zones in an electrostatic chuck, where a first zone is heated to 15° C. and the second zone is heated to 25° C. Crosstalk between these two zones may cause a relatively large portion of the first zone to actually have a temperature that is greater than 15° C. due to a proximity to the second zone. The level of crosstalk exhibited by conventional electrostatic chucks can be too high for some applications.

BRIEF DESCRIPTION OF THE DRAWINGS

The present invention is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION OF EMBODIMENTS

Described herein are embodiments of an electrostatic chuck having a thermally conductive base (also called a cooling plate) with multiple thermal zones that are approximately thermally isolated from one another. The different thermal zones are separated by thermal isolators (also called thermal breaks) that extend from an upper surface of the thermally conductive base towards a lower surface of the thermally conductive base. The thermal isolators may be filled with silicone, vacuum, or other thermally insulating material. Alternatively, the thermal isolators may be vented to atmosphere. The thermal isolators reduce crosstalk between thermal zones of the electrostatic chuck by as much as 50% as compared to traditional electrostatic chucks.

Figure 1:
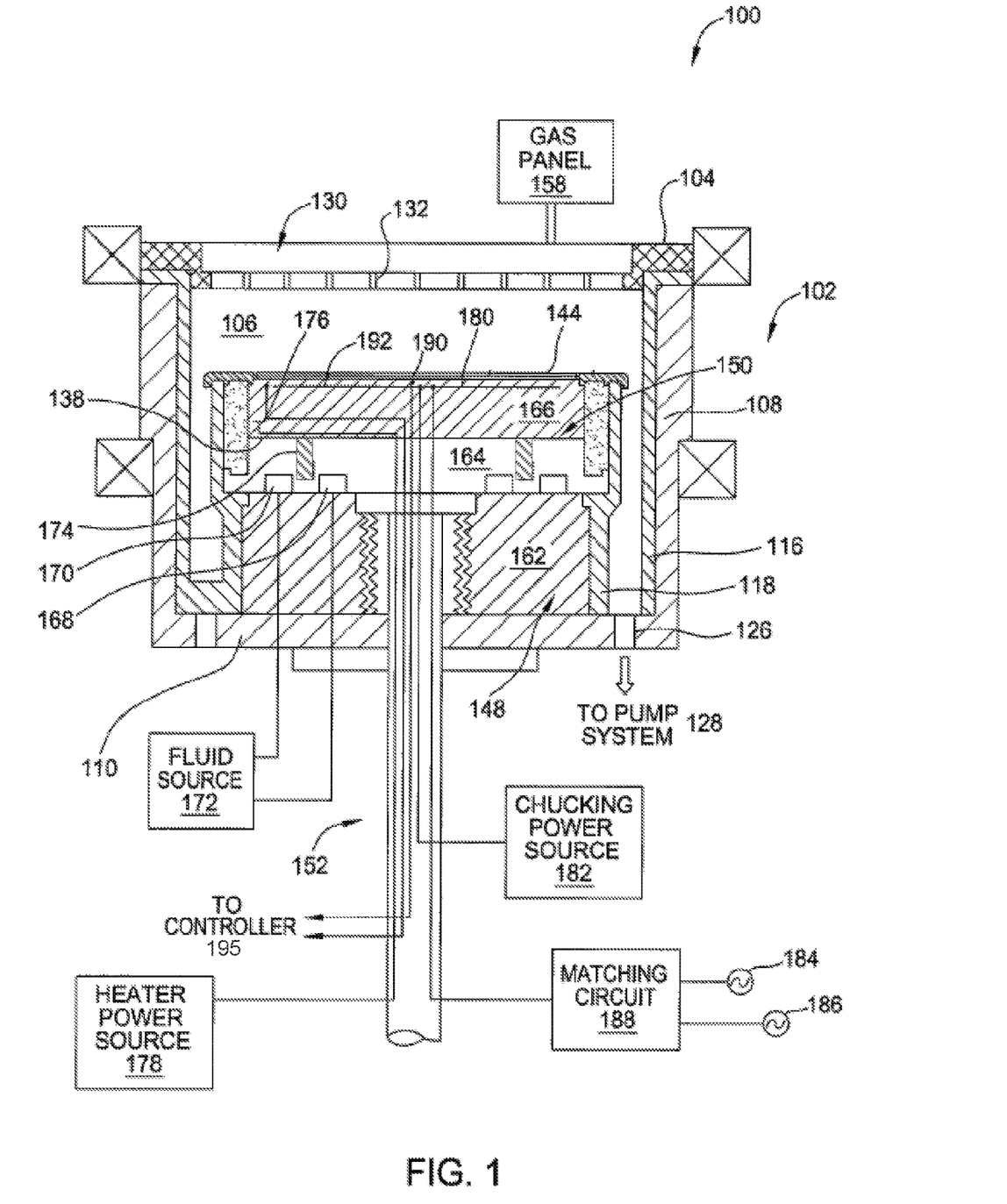
FIG. 1 depicts a sectional view of one embodiment of a processing chamber.

FIG. 1 is a sectional view of one embodiment of a semiconductor processing chamber 100 having a substrate support assembly 148 disposed therein. The processing chamber 100 includes a chamber body 102 and a lid 104 that enclose an interior volume 106. The chamber body 102 may be fabricated from aluminum, stainless steel or other suitable material. The chamber body 102 generally includes sidewalls 108 and a bottom 110. An outer liner 116 may be disposed adjacent to the side walls 108 to protect the chamber body 102. The outer liner 116 may be fabricated and/or coated with a plasma or halogen-containing gas resistant material. In one embodiment, the outer liner 116 is fabricated from aluminum oxide. In another embodiment, the outer liner 116 is fabricated from or coated with yttria, yttrium alloy or an oxide thereof.

An exhaust port 126 may be defined in the chamber body 102, and may couple the interior volume 106 to a pump system 128. The pump system 128 may include one or more pumps and throttle valves utilized to evacuate and regulate the pressure of the interior volume 106 of the processing chamber 100.

The lid 104 may be supported on the sidewall 108 of the chamber body 102. The lid 104 may be opened to allow access to the interior volume 106 of the processing chamber 100, and may provide a seal for the processing chamber 100 while closed. A gas panel 158 may be coupled to the processing chamber 100 to provide process and/or cleaning gases to the interior volume 106 through a gas distribution assembly 130 that is part of the lid 104. Examples of processing gases may be used to process in the processing chamber including halogen-containing gas, such as $C_2F_6$, $SF_6$, $SiCl_4$, HBr, $NF_3$, $CF_4$, $CHF_3$, $CH_2F_3$, $Cl_2$ and $SiF_4$, among others, and other gases such as $O_2$, or $N_2O$. Examples of carrier gases include $N_2$, He, Ar, and other gases inert to process gases (e.g., non-reactive gases). The gas distribution assembly 130 may have multiple apertures 132 on the downstream surface of the gas distribution assembly 130 to direct the gas flow to the surface of the substrate 144. Additionally, or alternatively, the gas distribution assembly 130 can have a center hole where gases are fed through a ceramic gas nozzle. The gas distribution assembly 130 may be fabricated and/or coated by a ceramic material, such as silicon carbide, yttria, etc. to provide resistance to halogen-containing chemistries to prevent the gas distribution assembly 130 from corrosion.

The substrate support assembly 148 is disposed in the interior volume 106 of the processing chamber 100 below the gas distribution assembly 130. The substrate support assembly 148 holds the substrate 144 during processing. An inner liner 118 may be coated on the periphery of the substrate support assembly 148. The inner liner 118 may be a halogen-containing gas resist material such as those discussed with reference to the outer liner 116. In one embodiment, the inner liner 118 may be fabricated from the same materials of the outer liner 116.

In one embodiment, the substrate support assembly 148 includes a mounting plate 162 supporting a pedestal 152, and an electrostatic chuck 150. The electrostatic chuck 150 further includes a thermally conductive base 164 bonded to a ceramic body (referred to as an electrostatic puck 166 or ceramic puck) via a bond 138. The electrostatic puck 166 may be fabricated by a ceramic material such as aluminum nitride (AlN) or aluminum oxide ($Al_2O_3$). The mounting plate 162 is coupled to the bottom 110 of the chamber body 102 and includes passages for routing utilities (e.g., fluids, power lines, sensor leads, etc.) to the thermally conductive base 164 and the electrostatic puck 166. In one embodiment, the mounting plate 162 includes a plastic plate, a facilities plate and a cathode base plate.

The thermally conductive base 164 and/or electrostatic puck 166 may include one or more optional embedded heating elements 176, embedded thermal isolators 174 and/or conduits 168, 170 to control a lateral temperature profile of the support assembly 148. The thermal isolators 174 (also referred to as thermal breaks) extend from an upper surface of the thermally conductive base 164 towards the lower surface of the thermally conductive base 164, as shown. The conduits 168, 170 may be fluidly coupled to a fluid source 172 that circulates a temperature regulating fluid through the conduits 168, 170.

The embedded thermal isolator 174 may be disposed between the conduits 168, 170 in one embodiment. The heater 176 is regulated by a heater power source 178. The conduits 168, 170 and heater 176 may be utilized to control the temperature of the thermally conductive base 164, thereby heating and/or cooling the electrostatic puck 166 and a substrate (e.g., a wafer) being processed. The temperature of the electrostatic puck 166 and the thermally conductive base 164 may be monitored using a plurality of temperature sensors 190, 192, which may be monitored using a controller 195.

The electrostatic puck 166 may further include multiple gas passages such as grooves, mesas, sealing bands (e.g., an outer sealing band (OSB) and/or an inner sealing band (ISB)) and other surface features, which may be formed in an upper surface of the electrostatic puck 166. The gas passages may be fluidly coupled to a source of a thermally conductive gas, such as He via holes drilled in the puck 166. In operation, the gas may be provided at controlled pressure into the gas passages to enhance the heat transfer between the electrostatic puck 166 and the substrate 144.

The electrostatic puck 166 includes at least one clamping electrode 180 controlled by a chucking power source 182. The electrode 180 (or other electrode disposed in the puck 166 or base 164) may further be coupled to one or more RF power sources 184, 186 through a matching circuit 188 for maintaining a plasma formed from process and/or other gases within the processing chamber 100. The sources 184, 186 are generally capable of producing RF signal having a frequency from about 50 kHz to about 3 GHz and a power of up to about 10,000 Watts.

Figure 2:
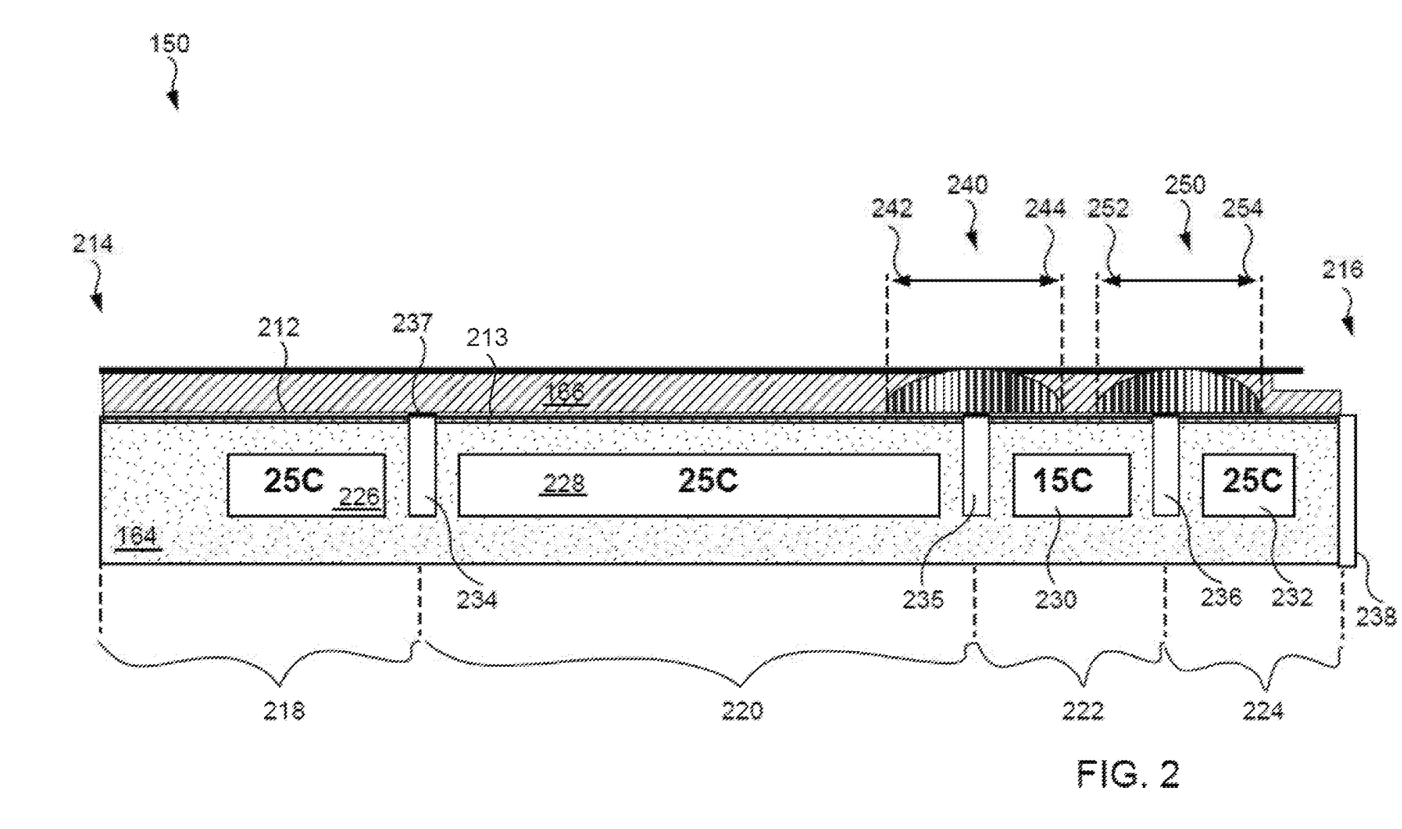
FIG. 2 depicts a cross sectional side view of one embodiment of an electrostatic chuck.

FIG. 2 depicts a cross sectional side view of a portion of the electrostatic chuck 150. The portion of the electrostatic chuck 150 includes a region between a center 214 of the electrostatic chuck 150 and an outer perimeter 216 of the electrostatic chuck 150. The term center of the electrostatic check 150 is used here to refer to the center of the electrostatic chuck 150 in a plane that is coplanar with a surface of the electrostatic chuck 150. The electrostatic chuck 150 includes the electrostatic puck 166 and the thermally conductive base 164 attached to the electrostatic puck 166. The electrostatic puck 166 is bonded to the thermally conductive base 164 by a bond 212. The bond 212 may be a silicone bond, or may include another bonding material. For example, the bond 212 may include a thermal conductive paste or tape having at least one of an acrylic based compound and silicone based compound. Example bonding materials include a thermal conductive paste or tape having at least one of an acrylic based compound and silicone based compound with metal or ceramic fillers mixed or added thereto. The metal filler may be at least one of Al, Mg, Ta, Ti, or combination thereof and the ceramic filler may be at least one of aluminum oxide ($Al_2O_3$), aluminum nitride (AlN), titanium diboride ($TiB_2$) or combination thereof.

The electrostatic puck 166 has a disc-like shape having an annular periphery that may substantially match the shape and size of a substrate positioned thereon. An upper surface of the electrostatic puck 166 may have numerous surface features (not shown). The surface features may include an outer sealing band (OSB), an inner sealing band (ISB), multiple mesas, and channels between the mesas. In one embodiment, the electrostatic puck 166 includes no ridges. Alternatively, the electrostatic puck 166 may include one or both of an ISB and an OSB. The electrostatic puck 166 may also include multiple holes through which a thermally conductive gas such as helium may be pumped.

The thermally conductive base 164 attached below the electrostatic puck 166 may have a disc-like main portion. In one embodiment, the thermally conductive base 164 is fabricated by a metal, such as aluminum or stainless steel or other suitable materials. Alternatively, the thermally conductive base 164 may be fabricated by a composite of ceramic and metal material providing good strength and durability as well as heat transfer properties. The composite material may have a thermal expansion coefficient that is substantially matched to the overlying puck 166 in one embodiment to reduce thermal expansion mismatch. The electrostatic puck 166 may be a ceramic material such as AlN or $Al_2O_3$, and may have an electrode (not illustrated) embedded therein.

In one embodiment, the electrostatic chuck 150 is divided into four thermal zones 218, 220, 222 and 224. A first thermal zone 218 extends from the center 214 of the electrostatic chuck 150 to a first thermal isolator 234. A second thermal zone 220 extends from the first thermal isolator 234 to a second thermal isolator 235. A third thermal zone 222 extends from the second thermal isolator 235 to a third thermal isolator 236. A fourth thermal zone extends from the third thermal isolator 236 to the perimeter 216 of the electrostatic chuck 150. In alternative embodiments, electrostatic chucks may be divided into greater or fewer thermal zones. For example, two thermal zones, three thermal zones, five thermal zones, or another number of thermal zones may be used.

Each of the thermal zones 218, 220, 222, 224 includes one or more conduits 226, 228, 230, 232 (also referred to as cooling channels). The conduits 226, 228, 230, 232 may each be connected to a separate fluid delivery line and through the separate fluid delivery line to a separate set point chiller. A set point chiller is a refrigeration unit that circulates a fluid such as a coolant. The set point chillers may deliver fluid having a controlled temperature through the conduits 226, 228, 230, 232, and may control the flow rate of the fluid. Accordingly, the set point chillers may control the temperature of the conduits 226, 228, 230, 232 and the thermal zones 218, 220, 222, 224 containing those conduits.

The different thermal zones 218, 220, 222, 224 may be maintained at different temperatures. For example, the first thermal zone 218, second thermal zone 220 and fourth thermal zone 224 are shown at 25° C. The third thermal zone 222 is shown at 15° C. The thermal isolators 234, 235, 236 provide an increased degree or amount of thermal isolation between the different thermal zones, and minimize crosstalk between the thermal zones. The thermal isolators 234, 235, 236 may provide approximate thermal isolation between thermal zones. Accordingly, some crosstalk (e.g., heat transfer) may occur between thermal zones. The thermal isolators extend from an upper surface of the thermally conductive base 164 (at the interface with the bond 212) approximately vertically into the thermally conductive base 164. The thermal isolators 234, 235, 236 extend from the upper surface towards a lower surface of the thermally conductive base 164, and may have various depths into the thermally conductive base 164. Because the thermal isolators 234, 235, 236 extend to the upper surface of the thermally conductive base 164, they minimize heat flux between the thermal zones within the electrostatic puck 166.

In one embodiment, thermal isolator 234 is 30 mm from a center of the electrostatic chuck 150, thermal isolator 235 is 90 mm from the center of the electrostatic chuck 150, and thermal isolator 236 is 134 mm from the center of the electrostatic chuck. Alternatively, the thermal isolators 234, 235, 236 may be located at different distances from the center of the electrostatic chuck 150. For example, thermal isolator 234 may be located 20-40 mm from the center of the electrostatic chuck 150, thermal isolator 235 may be located 80-100 mm from the center of the electrostatic chuck 150, and thermal isolator 236 may be located 120-140 mm from the center of the electrostatic chuck 150.

A first temperature gradient 240 is shown at the interface between the second thermal zone 220 and the third thermal zone 222 in the electrostatic puck 166. The first temperature gradient 240 has a high temperature of 25° C. at a first end 242 and a low temperature of 15° C. at a second end 244. Similarly, a second temperature gradient 250 is shown at the interface between the third thermal zone 222 and the fourth thermal zone 224 in the electrostatic puck 166. The second temperature gradient 250 has a low temperature of 15° C. at a first end 252 and a high temperature of 25° C. at a second end 254. Crosstalk between thermal zones (shown in the temperature gradients) is considerably less as compared to traditional electrostatic chucks. Such crosstalk may be reduced by around 50% as compared to traditional electrostatic chucks. For example, the increased temperature at the second thermal zone 220 may have a 50% lesser effect on the temperature of the third thermal zone 222 as compared to an electrostatic chuck in which thermal breaks extend from a bottom of the thermally conductive base.

The amount of crosstalk between adjacent zones may depend on a thickness of the electrostatic puck 166, a material composition of the electrostatic puck 166, whether thermally managed materials are used near the upper surface of the thermally conductive base 164, and the temperatures at which the adjacent thermal zones are maintained. Increasing the thickness of the electrostatic puck 166 may increase a crosstalk length, while decreasing the thickness may decrease the crosstalk length. Similarly, increasing the temperature difference between thermal zones may increase the crosstalk length, while reducing the temperature differences may reduce the crosstalk length. Additionally, use of a thermally managed material may reduce the crosstalk length.

The electrostatic chuck 150 may be used to support a substrate such as a wafer during a plasma etch process, a plasma clean process, or other process that uses plasma. Accordingly, an outer perimeter 216 of the thermally conductive base 164 may be coated with a plasma resistant layer 238. In some embodiments, a surface of the electrostatic puck 166 is also coated with the plasma resistant layer 238. The plasma resistant layer 238 may be a deposited or sprayed ceramic such as $Y_2O_3$ (yttria or yttrium oxide), $Y_4Al_2O_9$ (YAM), $Al_2O_3$ (alumina) $Y_3Al_5O_{12}$ (YAG), YAlO3 (YAP), SiC (silicon carbide), $Si_3N_4$ (silicon nitride), Sialon, AlN (aluminum nitride), AlON (aluminum oxynitride), $TiO_2$ (titania), $ZrO_2$ (zirconia), TiC (titanium carbide), ZrC (zirconium carbide), TiN (titanium nitride), TiCN (titanium carbon nitride) $Y_2O_3$ stabilized $ZrO_2$ (YSZ), and so on. The plasma resistant layer may also be a ceramic composite such as $Y_3Al_5O_{12}$ distributed in $Al_2O_3$ matrix, a $Y_2O_3$—$ZrO_2$ solid solution or a SiC—$Si_3N_4$ solid solution. The plasma resistant layer may also be a ceramic composite that includes a yttrium oxide (also known as yttria and $Y_2O_3$) containing solid solution. For example, the plasma resistant layer may be a ceramic composite that is composed of a compound $Y_4Al_2O_9$ (YAM) and a solid solution $Y_2$-$xZr_xO_3$ ($Y_2O_3$—$ZrO_2$ solid solution). Note that pure yttrium oxide as well as yttrium oxide containing solid solutions may be doped with one or more of $ZrO_2$, $Al_2O_3$, $SiO_2$, $B_2O_3$, $Er_2O_3$, $Nd_2O_3$, $Nb_2O_5$, $CeO_2$, $Sm_2O_3$, $Yb_2O_3$, or other oxides. Also note that pure Aluminum Nitride as well as doped Aluminum Nitride with one or more of $ZrO_2$, $Al_2O_3$, $SiO_2$, $B_2O_3$, $Er_2O_3$, $Nd_2O_3$, $Nb_2O_5$, $CeO_2$, $Sm_2O_3$, $Yb_2O_3$, or other oxides may be used. Alternatively, the protective layer may be sapphire or MgAlON.

The plasma resistant layer may be produced from a ceramic powder or a mixture of ceramic powders. For example, the ceramic composite may be produced from a mixture of a $Y_2O_3$ powder, a $ZrO_2$ powder and an $Al_2O_3$ powder. The ceramic composite may include $Y_2O_3$ in a range of 50-75 mol %, $ZrO_2$ in a range of 10-30 mol % and $Al_2O_3$ in a range of 10-30 mol %. In one embodiment, the ceramic composite contains approximately 77% $Y_2O_3$, 15% $ZrO_2$ and 8% $Al_2O_3$. In another embodiment, the ceramic composite contains approximately 63% $Y_2O_3$, 23% $ZrO_2$ and 14% $Al_2O_3$. In still another embodiment, the ceramic composite contains approximately 55% $Y_2O_3$, 20% $ZrO_2$ and 25% $Al_2O_3$. Relative percentages may be in molar ratios. For example, the ceramic composite may contain 77 mol % $Y_2O_3$, 15 mol % $ZrO_2$ and 8 mol % $Al_2O_3$. Other distributions of these ceramic powders may also be used for the ceramic composite.

During processing in a plasma rich environment, arcing may be caused inside of the thermal isolators 234, 235, 236. To avoid such arcing, the thermal isolators 234, 235, 236 may be filled with a thermally resistive dielectric material such as silicone or an organic bond material. Additionally or alternatively, tops of the thermal isolators 234, 235, 236 may be covered by an electrically conductive film 237. The electrically conductive film 237 preferably has poor thermal conductivity to minimize thermal crosstalk between thermal zones. Accordingly, the electrically conductive film may be very thin and/or may have a grid or wire mesh pattern. The electrically conductive film may have a thickness of about 200 to about 800 microns in some embodiments. In one embodiment, the electrically conductive film is an aluminum alloy (e.g., T6061) and has a thickness of about 500 microns (e.g., about 0.020 inches). Alternatively, the electrically conductive film may be other metals or other electrically conductive materials. The electrically conductive film 237 may prevent arcing within the thermal isolators 234. The electrically conductive film 237 may conform approximately to the shape of the thermal isolator 234, 235, 236 that is covers.

In one embodiment, the thermally conductive base 164 includes an encapsulated material 113 near or at the upper surface (e.g., where the thermally conductive base interfaces with the bond 212 and/or electrostatic puck 166). The encapsulated material 113 may have an anisotropic thermal conductivity. The material 113 may be a thermally managed material embedded in the thermally conductive base 164, the thermally managed material having different thermal conductive properties along a first direction and a second direction. Various bonding technologies may be used to bond the thermally managed material, such as diffusion bonding, flash bonding, lamination, soldering and brazing.

The encapsulated or embedded material 113 may be oriented in such a way that the material 113 has good thermal conductivity (e.g., around 1500 Watts/m-K) along the perimeter of the thermally conductive base and good thermal conductivity in the vertical direction (e.g., normal to a surface of the thermally conductive base), but has poor thermal conductivity (e.g., less than about 20 Watts/m-K) in the radial direction of the electrostatic chuck. Such an embedded material 113 can reduce crosstalk in the radial direction between thermal zones. In one embodiment, the embedded material 113 is a high thermal conductivity thermally pyrolytic graphite layer. In one embodiment, the thermally managed material is covered with an aluminum cover. The pyrolytic graphite may include highly oriented graphene stacks in bulk manufactured from thermal decomposition of hydrocarbon gas in a high temperature, chemical vapor deposition reactor. Examples of a high thermal conductivity thermally pyrolytic graphite include TC1050® Composite and TPG® by Momentive™. In one embodiment, the embedded material is encapsulated with coefficient of thermal expansion (CTE)-matched alloys or other materials.

Figure 3:
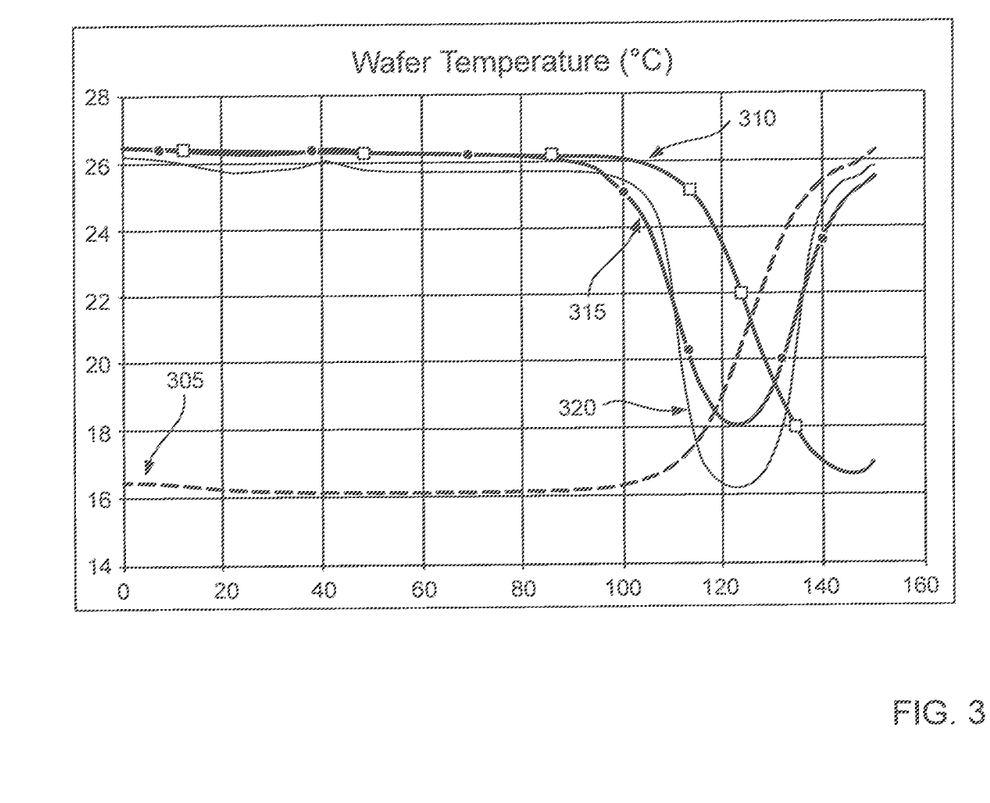
FIG. 3 is a graph illustrating crosstalk between thermal zones of some example electrostatic chucks.

FIG. 3 is a graph illustrating crosstalk between thermal zones of some example electrostatic chucks. A horizontal axis measures distance from a center of a wafer in millimeters, and a vertical axis measures temperature in degrees Centigrade. A first line 395 and second line 310 show a crosstalk length of approximately 20 mm for conventional electrostatic chucks, where the crosstalk length is the minimum separation distance between two thermal zones to maintain a desired temperature difference (e.g., a difference between 25° C. and 15° C. in the illustrated example). In one embodiment, the crosstalk length is defined as the length to go from 10% to 90% of temperature transmission. A third line 315 shows a crosstalk length of approximately 8.4 mm for an electrostatic chuck having thermal isolators as shown in FIG. 2 and an AlN electrostatic puck 166 with a thickness of 5 mm. A fourth line 320 shows a crosstalk length of approximately 6 mm for an electrostatic chuck having thermal isolators as shown in FIG. 2 and an AlN electrostatic puck 166 with a thickness of 1 mm. In some embodiments, the electrostatic puck is AlN, has a thickness of approximately 1-5 mm and has a crosstalk length of approximately 6-8.4 mm. Other thicknesses and/or ceramic materials (e.g., $Al_2O_3$) may be used for electrostatic pucks.

Figure 4:
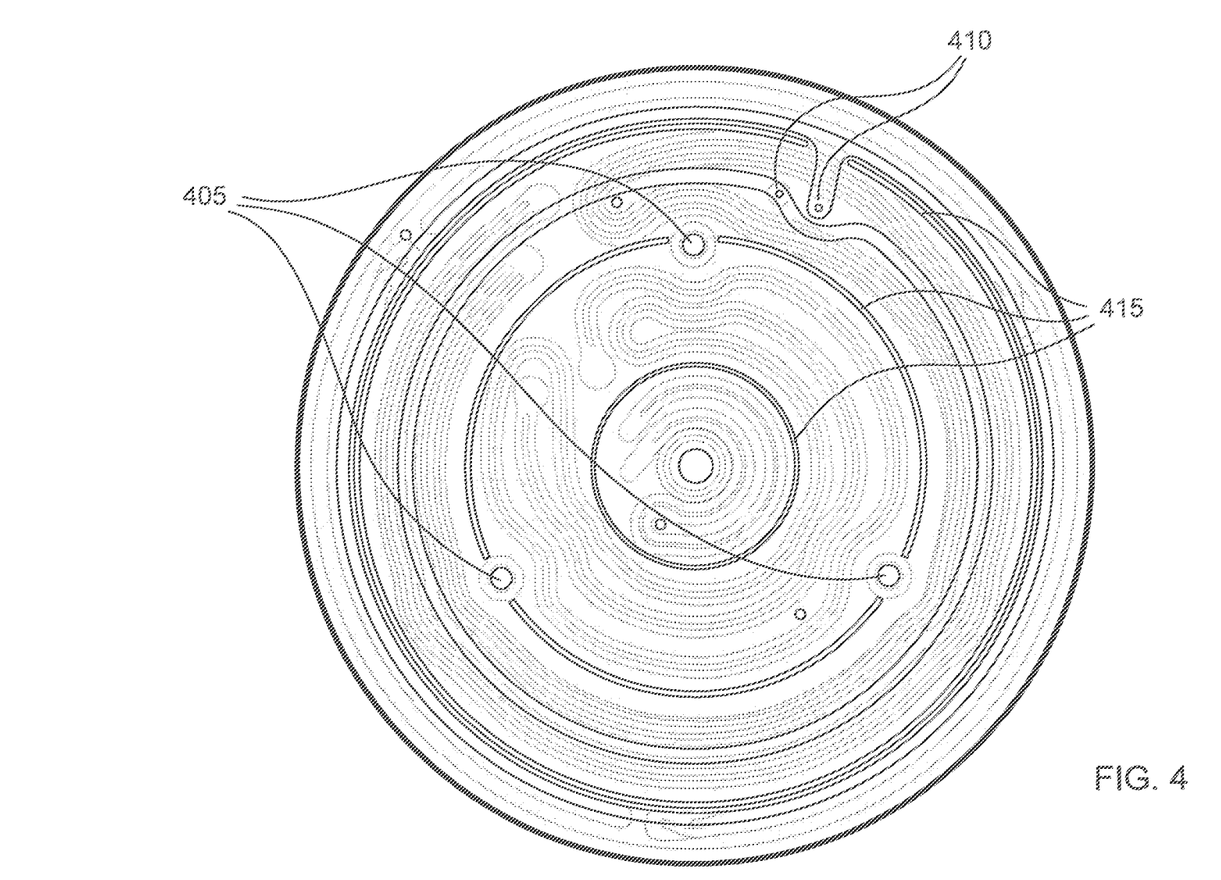
FIG. 4 is a top view of an electrostatic chuck, in accordance with one embodiment.

FIG. 4 is a top view of an electrostatic chuck, in accordance with one embodiment. The electrostatic chuck includes multiple thermal isolators 415, which may correspond to thermal isolators 234, 235, 236 of FIG. 2. As shown, the thermal isolators 415 may be routed around helium delivery holes 410 and lifter pin holes 405. Additionally, or alternatively, there may be breaks in the thermal isolators 415 where they would otherwise intersect with the lifter pin holes 405 and/or the helium delivery holes 410. Additionally, the thermal isolators may be discontinuous due to other features within the electrostatic chuck, such as mounting holes, electrodes, and so forth. The helium holes may deliver helium to different heat transfer zones on the electrostatic puck. The different heat transfer zones may be thermally isolated, and may each be filled with helium (or other backside gas) during processing to improve heat transfer between the electrostatic chuck and a chucked substrate. Having multiple heat transfer zones in the electrostatic puck may further improve an ability to fine tune temperature control of a chucked substrate.

Figure 5:
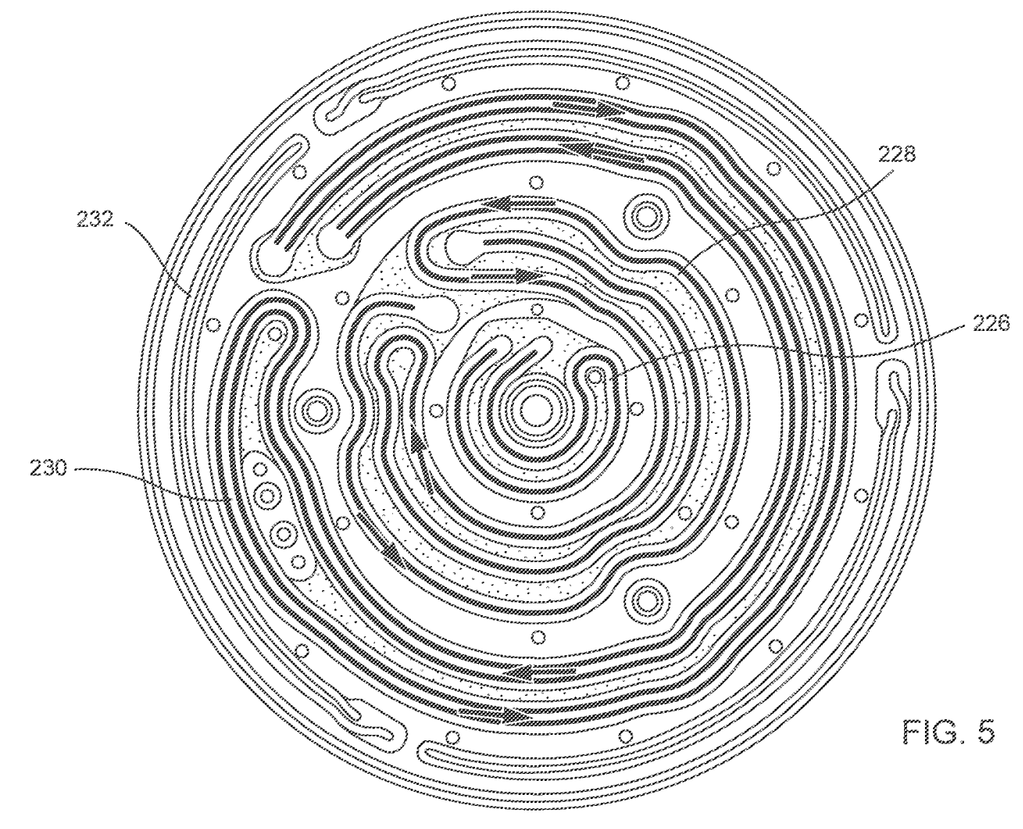
FIG. 5 is a bottom view of an electrostatic chuck, in accordance with one embodiment.

FIG. 5 is a bottom view of an electrostatic chuck, in accordance with one embodiment. FIG. 5 shows conduits 226, 228, 230, 232 in different thermal zones on the electrostatic chuck. As shown, the conduits and thermal zones that contain them are approximately concentric within the electrostatic chuck. The conduits are routed around features of the electrostatic chuck such as mounting holes, lifter pin holes, helium holes, electrodes, and so forth. Arrows show the direction of flow of cooling fluid within the conduits 226, 228, 230, 232. Coolant may flow through the conduits 226, 228, 230, 232 in a bi-directional pattern to improve temperature uniformity within the thermal zones. In one embodiment, the conduits have fins to increase a contact surface area between the conduits and the thermally conductive base that the conduits route through. As shown, conduit 232 is actually a set of three separate conduits that in one embodiment are connected to the same temperature controller (e.g., to the same set point chiller). However, in an alternative embodiment, the separate conduits may each be connected to different set point chillers. This may enable fine tuning of temperature within different regions of a single thermal zone.

Figure 6:
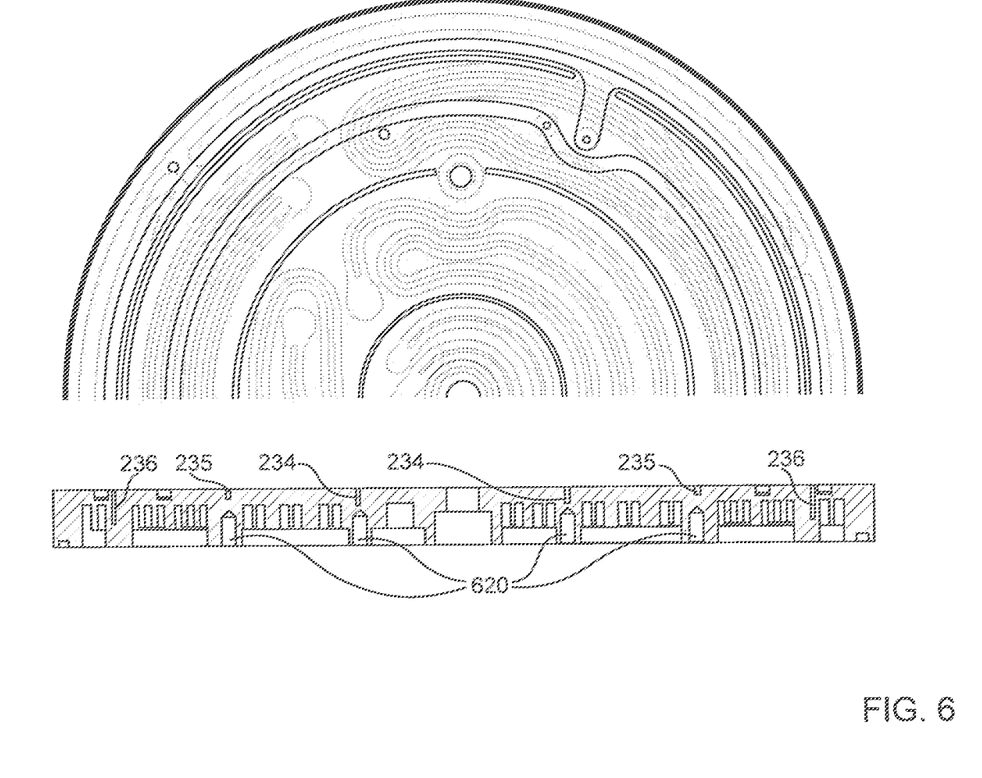
FIG. 6 is a cross sectional side view of an electrostatic chuck, in accordance with one embodiment.

FIG. 6 is a cross sectional side view of an electrostatic chuck, in accordance with one embodiment. Thermal isolators 234, 235 and 236 are shown. In the illustrated embodiment, thermal isolators 234 and 235 are located above mounting holes 620. Accordingly, the depth of the thermal isolators 234 and 235 is relatively shallow. In one embodiment, the depth of the thermal isolators 234, 235 is about ⅛ inches to about ¼ inches. Alternatively, the thermal isolators may be deeper or shallower. Thermal isolator 236 is not located above any mounting holes. Accordingly, thermal isolator 236 is has a greater depth, than thermal isolators 234 and 235. In some embodiments, the thermal isolator 236 may have a depth that is about 60%-90% of the total thickness of the cooling base. In one embodiment, the thermal isolator 236 has a depth that is approximately 75% of the total thickness of the cooling base.

Figure 7:
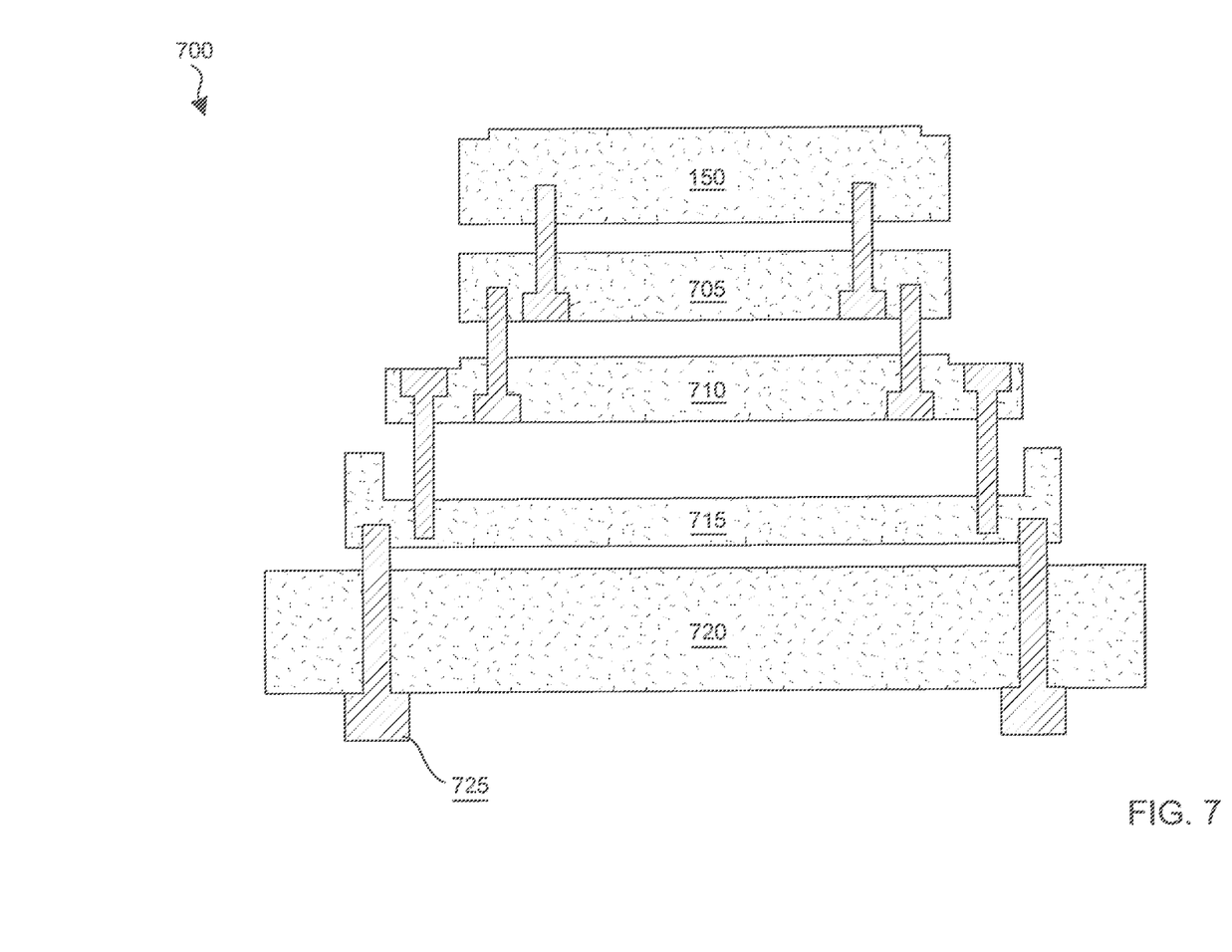
FIG. 7 is a cross sectional side view of an electrostatic chuck assembly stack.

FIG. 7 is a cross sectional side view of an electrostatic chuck assembly stack 700. The electrostatic chuck assembly stack 700 includes an electrostatic chuck 150 (also referred to as an electrostatic chuck assembly) bolted to an insulation plate (e.g., a rexolite plate or other plastic plate) 705, which provides electrical isolation from the underneath grounded hardware (e.g., from the rest of the electrostatic chuck assembly stack. The insulation plate 705 is in turn bolted to a facilities plate 710 from underneath. The main purpose of facilities plate is to provide structural support for insulation plate 705 and provide multiple coolant channels at the edge of the ESC cooling plate. A cathode base plate 715 is also bolted to a chamber body 720 from underneath. The cathode base plate 715 provides routing for the multiple cooling channels from incoming chiller connections to the components of ESC subsystem above it. The cathode base plate 715 also provides structural support at the bottom of a chamber to mount the ESC on the top. The facilities plate 710 is configured to have mounting holes that are externally accessible from above. Accordingly, the facilities plate 710 can be bolted to the cathode base plate 715 from above. This may significantly simplify installation and removal of a stack including the electrostatic chuck 150, plastic plate 705 and facilities plate 710 from a chamber as compared to traditional stack configurations.

Figure 8:
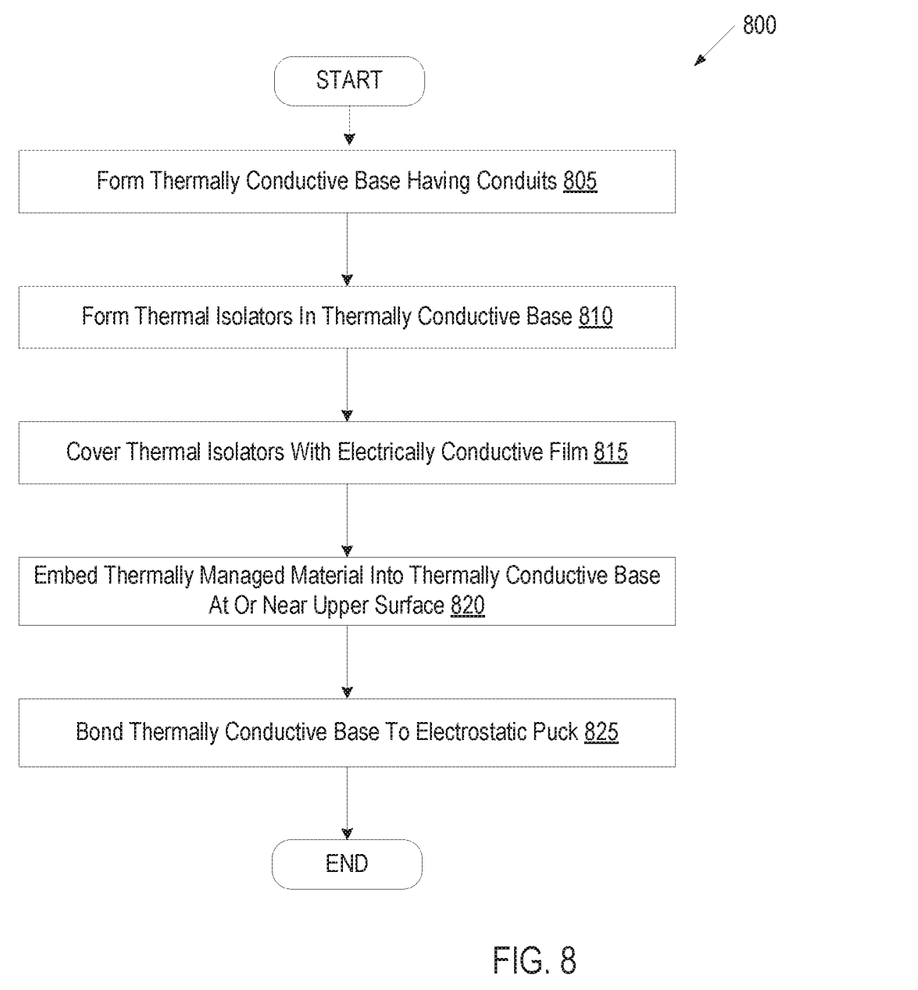
FIG. 8 illustrates a process for manufacturing an electrostatic chuck, in accordance with embodiments of the present invention.

FIG. 8 illustrates a process 800 for manufacturing an electrostatic chuck, in accordance with embodiments of the present invention. At block 805 of process 800, a thermally conductive base having conduits therein is formed. The conduits are formed by a milling process, with subsequent brazing or e-beam welding to provide vacuum integrity. For example, the thermally conductive base may be two parts, and a milling process may be performed to form the conduits in one or both of the parts. These parts may then be bonded together to form a single thermally conductive base. The thermally conductive base may be an aluminum, aluminum allow, stainless steel or other metal base having a disc-like shape. Alternatively, the thermally conductive base may be formed from other thermally conductive materials. At block 810, thermal isolators are formed in the thermally conductive base. The thermal isolators may be formed by machining the thermally conductive base from the upper surface of the thermally conductive base to form multiple voids. The voids may be approximately concentric voids. The voids may have approximately uniform depths or may have varying depths. In one embodiment, the voids are approximately vertical trenches extending from the upper surface of the thermally conductive base that extend towards (but not completely to) the lower surface of the thermally conductive base. In some embodiments, the voids are filled with an organic bond material, a silicone, or another material with low thermal conductivity. Alternatively, the voids may be sealed to vacuum, or may be vented to air.

In one embodiment, at block 815 the thermal isolators are covered with thin electrically conductive films. Various techniques may be used to form or place the films over the thermal isolators. For example, the thermally conductive base may be masked so that only areas above the thermal isolators are exposed by a mask. An electrically conductive coating may then be deposited (e.g., by chemical vapor deposition (CVD), physical vapor deposition (PVD), atomic monolayer deposition (ALD), etc.) on the thermally conductive base. The coating could be in the form of metal film, foil, or conductive metal oxide films such as Indium-Tin Oxide (ITO).

In one embodiment, at block 820 a thermally managed material such as those discussed above is embedded into the thermally conductive base at or near an upper surface of the thermally conductive base. For example, a wafer or disc of the thermally managed material may be bonded to the upper surface, and may be covered by another material such as aluminum. Alternatively, a depression may be formed (e.g., machined) into the upper surface of the thermally conductive base. A disc or wafer of the thermally managed material having the shape of the formed depression may then be inserted into the depression and bonded to the thermally conductive base.

At block 825, the thermally conductive base is bonded to an electrostatic puck or other ceramic puck. The thermally conductive base may be bonded to the electrostatic puck by an organic bond material such as silicone.

The preceding description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±25%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:
1. A substrate support assembly comprising:
   a ceramic puck; and
   a thermally conductive base having an upper portion that is bonded to a lower surface of the ceramic puck, wherein the thermally conductive base comprises:
   a main portion comprising a plurality of thermal zones;
   the upper portion comprising a thermally managed material bonded to an upper surface of the main portion of the thermally conductive base, the thermally managed material having a first thermal conductivity in a radial direction and a second thermal conductivity in a vertical direction that is normal to the upper surface of the main portion of the thermally conductive base, wherein the second thermal conductivity is higher than the first thermal conductivity; and
   a plurality of thermal isolators that extend from the upper surface of the main portion of the thermally conductive base towards a lower surface of the thermally conductive base between two or more of the plurality of thermal zones without contacting the lower surface of the thermally conductive base, wherein each of the plurality of thermal isolators provides a degree of thermal isolation between the two or more of the plurality of thermal zones at the upper surface of the main portion of the thermally conductive base.

2. The substrate support assembly of claim 1, wherein:
the thermally conductive base comprises a plurality of conduits;
each of the plurality of conduits is disposed in a corresponding thermal zone without contacting the upper surface of the main portion of the thermally conductive base and without contacting the thermally managed material; and
each of the plurality of thermal isolators is between adjacent conduits of the plurality of conduits.

3. The substrate support assembly of claim 1, wherein the thermally managed material further has the second thermal conductivity along a perimeter of the thermally conductive base.

4. The substrate support assembly of claim 1, wherein a depression is formed in the upper surface of the main portion of the thermally conductive base, wherein the thermally managed material has a shape corresponding to the depression and is inserted into the depression.

5. The substrate support assembly of claim 1, wherein the thermally managed material is bonded to the upper surface of the main portion of the thermally conductive base using one or more of diffusion bonding, flash bonding, lamination, soldering, or brazing.

6. The substrate support assembly of claim 1, wherein the upper portion of the thermally conductive base comprises an aluminum cover disposed on the thermally managed material.

7. The substrate support assembly of claim 1, wherein the thermally managed material comprises a high thermal conductivity thermally pyrolytic graphite layer.

8. A method of manufacturing an electrostatic chuck, the method comprising:
forming a main portion of a thermally conductive base, wherein the main portion of the thermally conductive base comprises a plurality of thermal zones;
forming a plurality of thermal isolators that extend from an upper surface of the main portion of the thermally conductive base towards a lower surface of the thermally conductive base between two or more of the plurality of thermal zones without contacting the lower surface of the thermally conductive base, wherein each of the plurality of thermal isolators provides a degree of thermal isolation between the two or more of the plurality of thermal zones at the upper surface of the main portion of the thermally conductive base;
bonding a thermally managed material to the upper surface of the main portion of the thermally conductive base to form an upper portion of the thermally conductive base, the thermally managed material having a first thermal conductivity in a radial direction and a second thermal conductivity in a vertical direction that is normal to the upper surface of the main portion of the thermally conductive base, wherein the second thermal conductivity is higher than the first thermal conductivity; and
bonding the upper portion of the thermally conductive base to an electrostatic puck.

9. The method of claim 8, wherein:
the thermally conductive base comprises a plurality of conduits;
each of the plurality of conduits is disposed in a corresponding thermal zone without contacting the upper surface of the main portion of the thermally conductive base and without contacting the thermally managed material; and
each of the plurality of thermal isolators is between adjacent conduits of the plurality of conduits.

10. The method of claim 8, wherein the thermally managed material further has the second thermal conductivity along a perimeter of the thermally conductive base.

11. The method of claim 8, wherein a depression is formed in the upper surface of the main portion of the thermally conductive base, wherein the thermally managed material has a shape corresponding to the depression and is inserted into the depression.

12. The method of claim 8, wherein the thermally managed material is bonded to the upper surface of the main portion of the thermally conductive base using one or more of diffusion bonding, flash bonding, lamination, soldering, or brazing.

13. The method of claim 8, wherein the upper portion of the thermally conductive base comprises an aluminum cover disposed on the thermally managed material.

14. The method of claim 8, wherein the thermally managed material comprises a high thermal conductivity thermally pyrolytic graphite layer.

15. A thermally conductive base for an electrostatic chuck, the thermally conductive base comprising:
a main portion comprising a plurality of thermal zones;
an upper portion comprising a thermally managed material bonded to an upper surface of the main portion of the thermally conductive base, the thermally managed material having a first thermal conductivity in a radial direction and a second thermal conductivity in a vertical direction that is normal to the upper surface of the main portion of the thermally conductive base, wherein the second thermal conductivity is higher than the first thermal conductivity; and
a plurality of thermal isolators that extend from the upper surface of the main portion of the thermally conductive base towards a lower surface of the thermally conductive base between two or more of the plurality of thermal zones without contacting the lower surface of the thermally conductive base, wherein each of the plurality of thermal isolators provides a degree of thermal isolation between the two or more of the plurality of thermal zones at the upper surface of the main portion of the thermally conductive base.

16. The thermally conductive base of claim 15, wherein the thermally managed material further has the second thermal conductivity along a perimeter of the thermally conductive base.

17. The thermally conductive base of claim 15, wherein a depression is formed in the upper surface of the main portion of the thermally conductive base, wherein the thermally managed material has a shape corresponding to the depression and is inserted into the depression.

18. The thermally conductive base of claim 15, wherein the thermally managed material is bonded to the upper surface of the main portion of the thermally conductive base using one or more of diffusion bonding, flash bonding, lamination, soldering, or brazing.

19. The thermally conductive base of claim 15, wherein the upper portion of the thermally conductive base comprises an aluminum cover disposed on the thermally managed material.

20. The thermally conductive base of claim 15, wherein the thermally managed material comprises a high thermal conductivity thermally pyrolytic graphite layer.

* * * * *